United States Patent [19]
Ho et al.

[11] Patent Number: 6,153,474
[45] Date of Patent: Nov. 28, 2000

[54] METHOD OF CONTROLLABLY FORMING A LOCOS OXIDE LAYER OVER A PORTION OF A VERTICALLY EXTENDING SIDEWALL OF A TRENCH EXTENDING INTO A SEMICONDUCTOR SUBSTRATE

[75] Inventors: Herbert Lei Ho, New Windsor, N.Y.; Radhika Srinivasan, Mahwah, N.J.; Scott D. Halle, Hopewell Junction, N.Y.; Erwin Hammerl, Zangberg, Germany; David M. Dobuzinsky, Hopewell Junction; Jack Allan Mandelman, Stormville, both of N.Y.; Mark Anthony Jaso, Fairfax Station, Va.

[73] Assignee: International Business Machines Corporation, Armonk, N.Y.

[21] Appl. No.: 09/108,619

[22] Filed: Jul. 1, 1998

Related U.S. Application Data

[63] Continuation of application No. 08/784,558, Jan. 21, 1997, Pat. No. 5,849,638, which is a continuation-in-part of application No. 08/610,912, Mar. 4, 1996, Pat. No. 5,656,535.

[51] Int. Cl.[7] .................................................. H01L 21/336
[52] U.S. Cl. ....................... 438/270; 438/242; 438/243; 438/244; 438/245; 438/268; 438/259
[58] Field of Search ..................................... 438/712, 242, 438/243, 244, 245, 246, 247, 248, 249, 426, 425, 270; 216/47, 66; 204/192.34

[56] References Cited

U.S. PATENT DOCUMENTS

| | | |
|---|---|---|
| 4,016,062 | 4/1977 | Mehta et al. . |
| 4,128,765 | 12/1978 | Franks . |
| 4,214,966 | 7/1980 | Mahoney . |
| 4,309,267 | 1/1982 | Boyd et al. . |
| 4,502,913 | 3/1985 | Lechaton et al. . |
| 5,096,849 | 3/1992 | Beilstein et al. . |
| 5,205,902 | 4/1993 | Horton et al. . |
| 5,225,697 | 7/1993 | Malhi et al. ............................. 257/302 |
| 5,350,499 | 9/1994 | Shibaike et al. . |
| 5,360,758 | 11/1994 | Bronner et al. . |
| 5,395,786 | 3/1995 | Hsu et al. . |
| 5,422,294 | 6/1995 | Noble et al. . |
| 5,470,778 | 11/1995 | Nagata et al. ............................. 437/52 |
| 5,525,531 | 6/1996 | Bronner et al. . |
| 5,656,535 | 8/1997 | Ho et al. . |
| 5,658,816 | 8/1997 | Rajeevakumar ........................ 438/386 |
| 5,692,281 | 12/1997 | Rajeevakumar ........................ 29/25.42 |
| 5,717,628 | 2/1998 | Hammerl et al. ....................... 365/149 |
| 5,827,765 | 10/1998 | Stengl et al. ............................. 438/243 |
| 5,937,296 | 8/1999 | Arnold ................................... 438/270 |

FOREIGN PATENT DOCUMENTS

| | | |
|---|---|---|
| 59-208749A | 11/1984 | Japan . |
| 62-125680A | 6/1987 | Japan . |
| 1-149957 A2 | 6/1989 | Japan . |

OTHER PUBLICATIONS

Ozaki et al "0.228 um$\hat{2}$ Trench Cell Tech With Bottle–Shaped Capacitor for 1Gbit DRAMS" IEDM 95, pp. 661–661–664.

*Primary Examiner*—Caridad Everhart
*Assistant Examiner*—Victor Yevsikov
*Attorney, Agent, or Firm*—Daryl K. Neff

[57] ABSTRACT

The present invention includes a method and system to increase the deep trench sidewall surface area in a storage node on a DRAM chip. By tilting the trenches the capacitance is increased without taking up more space on the semiconductor chip.

18 Claims, 8 Drawing Sheets

METHOD OF CONTROLLABLY FORMING A LOCOS OXIDE LAYER OVER A PORTION OF A VERTICALLY EXTENDING SIDEWALL OF A TRENCH EXTENDING INTO A SEMICONDUCTOR SUBSTRATE

CROSS-REFERENCES TO RELATED APPLICATIONS

This application is a continuation of U.S. patent application Ser. No. 08/784,558 filed Jan. 21, 1997 now U.S. Pat. No. 5,849,638, which application is a continuation-in-part of U.S. patent application Ser. No. 08/610,912, filed on Mar. 4, 1996 now U.S. Pat. No. 5,656,535.

BACKGROUND OF THE INVENTION

1. Technical Field

The present invention relates generally to a method and system of manufacturing integrated circuit (IC) chips and the IC chips formed by the implementation of the method. More specifically, the present invention relates to methods and systems to increase the capacitance of a storage node by increasing the deep trench sidewall surface area.

2. Background Art

The trend in semiconductor device fabrication towards increasing density of circuit components requires that smaller areas of the circuit be devoted to isolation of the circuit components and capacitive storage areas. The need to reduce the surface area used for circuit components such as isolation structures and large area capacitor devices has resulted in the development of structures vertically oriented with respect to the plane of the substrate surface. These vertical structures may consist of some type of trench structure sunk into the semiconductor substrate and are positioned between charge carrying components of adjacent transistors. The effective surface area of the capacitor was maintained by placing the capacitor on the sides of a narrow trench etched into the silicon. The utilization of a trench structure enables the formation of a structure having large volume while minimizing the amount of surface area consumed.

Ever decreasing lithographic images drive smaller and smaller trench sizes with a corresponding reduction in the storage charge which may be held in a capacitor trench cell. Less charges creates both read problems and data integrity problems. One way to increase charge storage is by increasing the trench area using the same real estate (space) of the chip.

SUMMARY OF THE INVENTION

The present invention provides a method of controllably forming a LOCOS (local oxidation of semiconductor) oxide-containing layer over a portion of a substantially vertically extending sidewall of a trench which extends into a semiconductor substrate. According to one aspect of the invention, the method involves forming a layer of covering material on a substantially vertically extending sidewall of a trench which extends into a semiconductor substrate, partially removing the layer of covering material over only a portion of the sidewall to expose an underlying region, and growing an oxide-containing layer over the exposed portion by local oxidation of the underlying region.

According to another aspect of the invention, a method is provided for controllably defining boundaries of an oxide-containing layer formed on a substantially vertically extending sidewall of a trench extending into a semiconductor substrate. This alternate method involves depositing a conformal layer on a substantially vertically extending sidewall of a trench, growing an oxide-containing layer on the sidewall by local oxidation, filling the trench with a resist material, and etching the resist material a predetermined depth, thereby removing a portion of the oxide-containing layer from an upper portion of the sidewall in order to space the oxide-containing layer a selected distance from a surface of the substrate.

DESCRIPTION OF THE PREFERRED EMBODIMENTS

Although the present invention will be described with regard 5 to fabricating a dynamic random access memory (DRAM) cell, it should be understood that the present invention is equally useful in other types of integrated circuits.

Also, although the term "trench" is being used to indicate a storage node in the following description it could also be used 10 to indicate other circuit features which may be advantageous to orient at an angle from the vertical.

In accordance with the present invention, it has been discovered a system and method of obtaining trench pairs that are symmetrical with regard to their profile about an axis perpendicular to the wafer surface and are mirrored with respect to each other. The objective of the present invention being to increase the area and hence the capacitance of the trench while allowing it to fit within the existing groundrules.

One of the problems with conventional storage capacitance is that it is limited by image size and trench depth. Image size refers to the image placed on the surface of the silicon wafer through the process of photolithography. Photolithography consists of passing a light through a circuit pattern on a photomask onto a light-sensitized surface of a semiconductor and chemically etching away unwanted portions of the surface. As circuits have become more dense, there is a conflict between the image size and the storage capacitance for space on the surface.

Figure 1A:
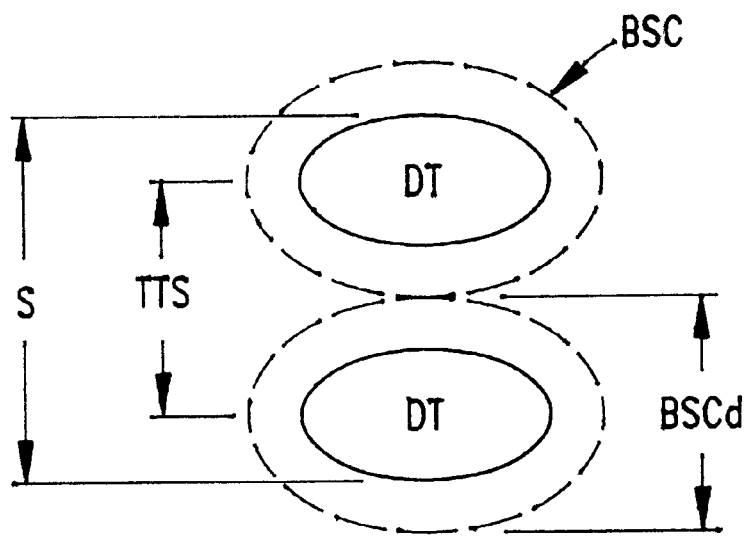
FIG. 1(a) shows a top view of a conventional non-tilted deep trench pair.

FIG. 1(a) shows a top view of a conventional non-tilted deep trench pair each labeled DT. Also shown is the trench-to-trench spacing TTS between the deep trenches and the diameter of the bottle-shaped capacitor BSC which is labeled BSCd. A bottle-shaped deep-trench capacitor is one that has a larger diameter at the bottom of the trench. The amount of surface space that is occupied by the trench pair is labeled S. As can be seen, a factor that limits the length of the trench in the first and second embodiments and the width BSCd in the second embodiment is the lack of space available on the surface area. Therefore, a way to increase the sidewall surface area is to make improvements in the vertical direction.

Figure 1B:
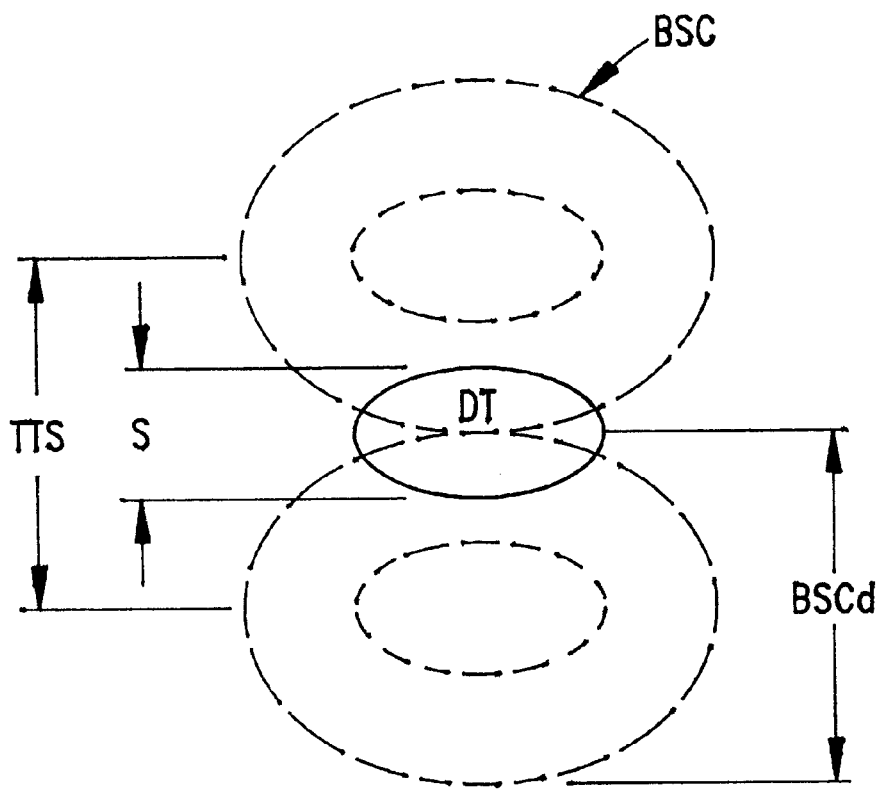
FIG. 1(b) shows a top view of a tilted deep trench pair in accordance with the present invention.
Figure 2:
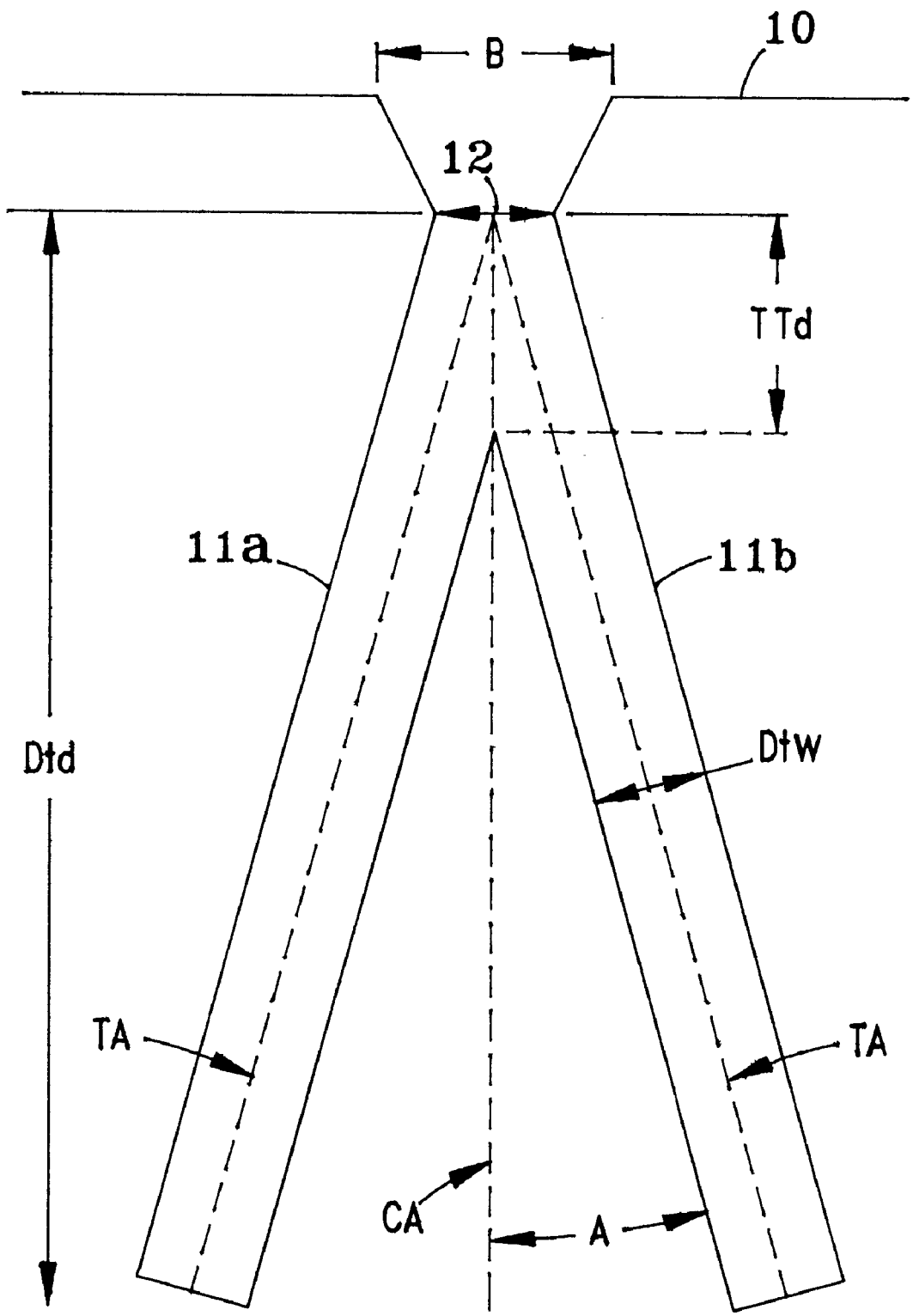
FIG. 2 shows a first embodiment of the present invention which shows a pair of mirrored trenches.
Figure 3:
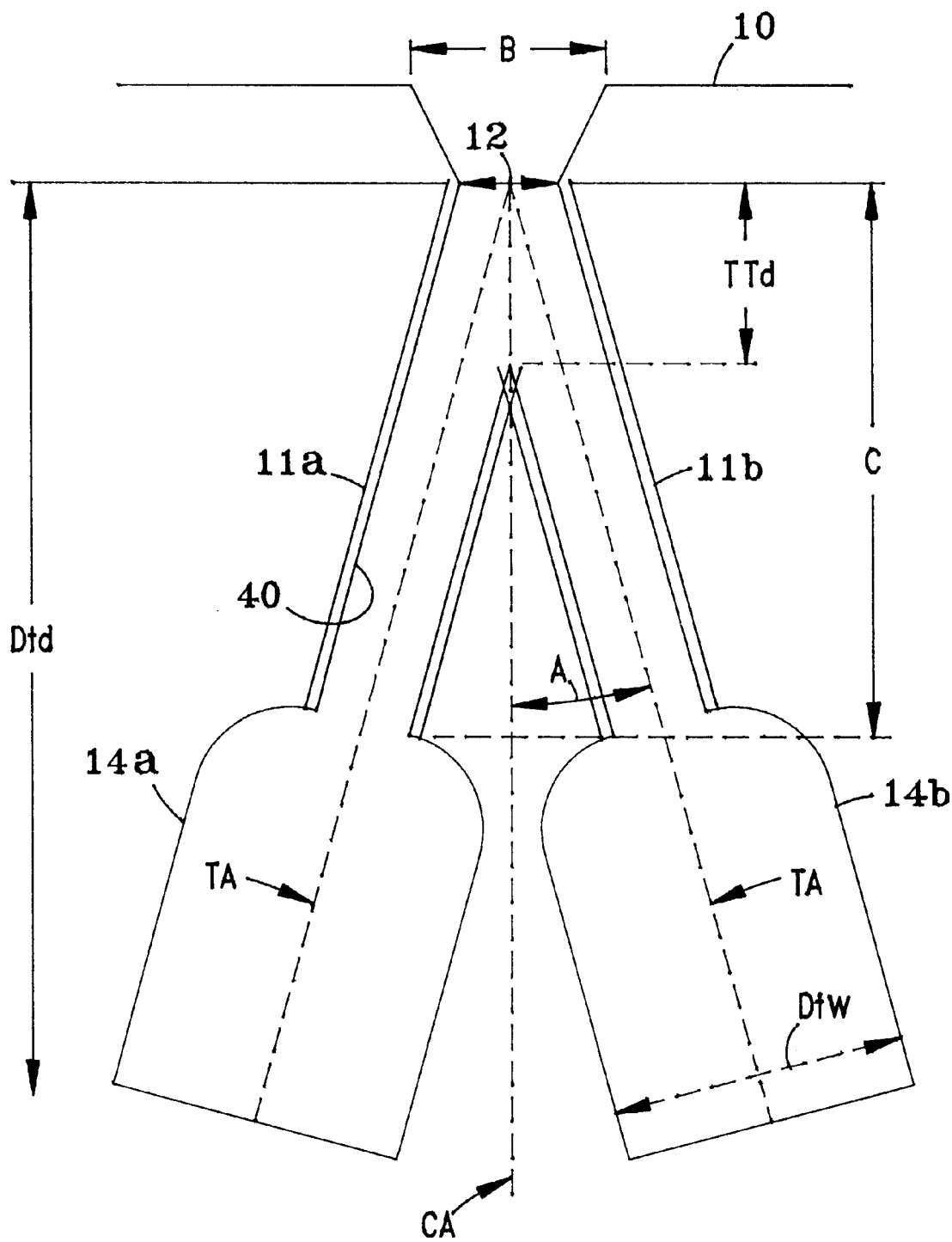
FIG. 3 shows a second embodiment of the present invention with a pair of mirrored trenches with a bottle-shape.

FIGS. 1(b), 2, and 3 show the tilted deep trench pair in accordance with the first and second embodiments of the present invention and demonstrates the reduction in real estate (space) on the surface and the enhanced sidewall surface obtained by the capacitors. As shown in FIG. 1(b), the surface area S has decreased while the trench to trench spacing TTS and the width of the sidewalls for both the first embodiment and second embodiment have increased.

FIG. 2 shows a cross-sectional view of the first embodiment of the present invention. FIG. 2 shows a mask 10 with first tilted deep trench 11a and second tilted deep trench 11b. Mask 10 has a single opening 12 for the outlets of both trenches. The mask 10 may be a layer of tetraethylorthosilicate (TEOS) resting on a pad oxide layer (not shown) and a SiN pad layer (not shown). TA is the trench axis which extends down the center of each of the trenches and CA is the central axis which is located in the center between both of the trench axes. Angle A is the tilt angle of the trench off of the central axis CA and it may be in the range of 1 to 16 degrees and ideally 7 to 8 degrees to obtain the maximum side wall surface area. Dtd is a measure of the deep trench depth and this may range from 6 to 8 $\mu$m. Dtw is a measure of the deep trench width and this may range from 0.175 to 0.380 $\mu$m. B is the width of the mask opening which may range from 0.2 to 0.4 $\mu$m. TTd is the top taper depth and it may range from 0.25 to 0.33 $\mu$m. Note that these distances will vary depending on, for instance, the density of the circuits on the chip. Also, these dimensions will change as improvements in technology lead to smaller and smaller integrated circuits.

FIG. 3 shows a cross-sectional view of a second embodiment of the present invention which has the pair of tilted trenches each having a bottle-shape. The bottle-shaped capacitors 14a and 14b have a larger diameter than the opening for the storage node. The advantages of bottle-shaped capacitors are discussed in the article "0.229 $\mu$m$^2$ Trench Cell Technologies with Bottle-Shaped Capacitor for 1 Gbit DRAMs", Ozaki et al., IEDM Tech. Dig. 662 (1995), which is hereby incorporated by reference.

As previously discussed, conventional bottle-shaped capacitors are limited in size by the trench-to-trench spacing TTS. In accordance with the present invention there is an increase in the trench-to-trench spacing at the depth of the isolation collar by forming pairs of trenches tilted away from each other. In FIG. 3, C is the length of the surface to the top of the bottle-shapes and this may be approximately 1 $\mu$m.

Figure 4:
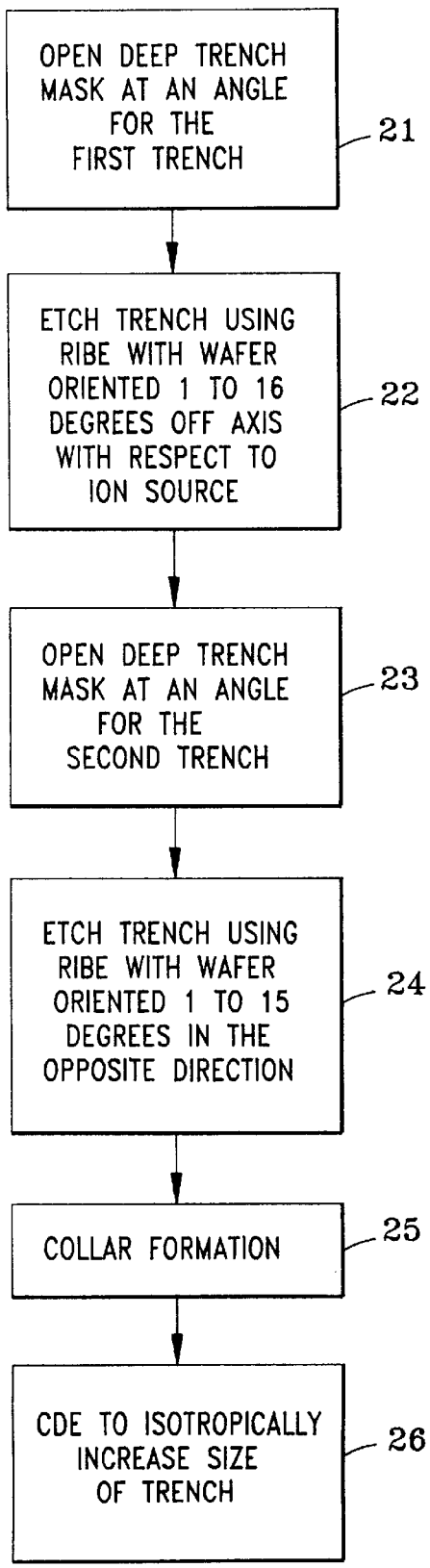
FIG. 4 shows a flowchart of the method of the present invention.

The symmetrical mirrored trench pair may be achieved using the technique described in the flowchart of FIG. 4 and shown in FIGS. 5(a)–5(i).

Figure 5A:
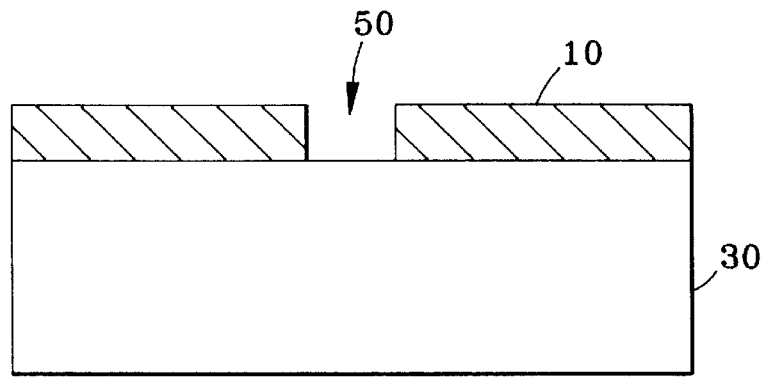
FIG. 5(a) is cross-sectional view of the mask with a central opening for the deep trenches.
Figure 5B:
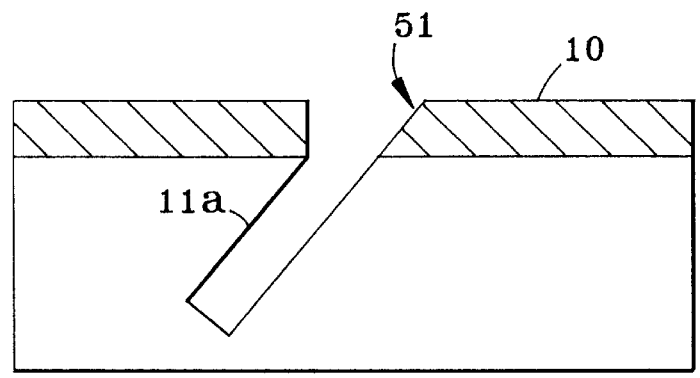
FIG. 5(b) is a cross-sectional view after the first etching step is finished.
Figure 5C:
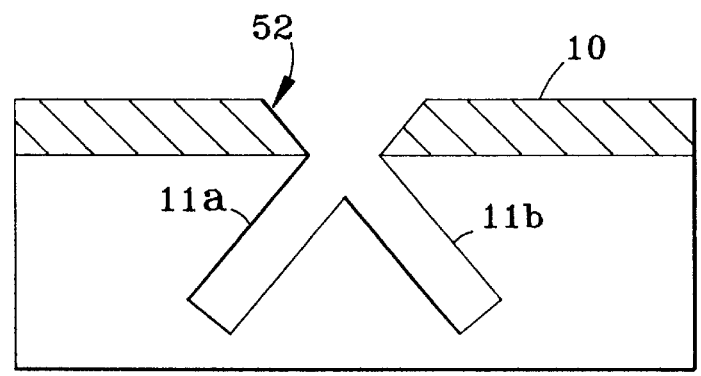
FIG. 5(c) is a cross-sectional view after the second etching step is finished.

FIG. 5(a) shows the deep trench mask 10 with an opening 50 on a silicon substrate 30. The first step 21 is to open the deep trench mask 10 at an angle off of the central axis CA at a first location 51 by etching as shown in FIG. 5(b). The next step 22 is to etch the first trench in the silicon substrate 30 using reactive ion beam etching (RIBE) with the wafer tilted or oriented in the range of 1 to 16 degrees off of the central axis CA with respect to the ion source with the ideal being in the range of 7 to 8 degrees off axis as shown in FIG. 5(b). The next step 23 is to open the deep trench mask 10 at an angle off of the central axis CA at a second location 52 as shown in FIG. 5(c). The next step 24 is to perform another etching using RIBE with the wafer tilted or oriented in the range of 1 to 16 degrees off axis in the opposite direction and again the ideal being in the range of 7 to 8 degrees off axis in the opposite direction as shown in FIG. 5(c).

At this point, if the first embodiment of the present invention is desired, step 24 is followed by simply removing the mask 10 to obtain FIG. 2. To obtain the second embodiment of the present invention the next step is the collar formation step 25.

The step of collar formation 25 consists of forming a thermally grown oxide which is used as a collar at the top of the deep trench. A method of collar formation is further discussed in U.S. patent application Ser. No. 08/610,912, filed on Mar. 4, 1996, which is hereby incorporated by reference. This collar formation method simplifies the storage node formation portion of the deep process by reducing the number of polysilicon fills and chemical-mechanical polishes from three to one and which also provides a smooth transition between the node dielectric and the collar oxide. This is accomplished in the collar formation method by employing a resist fill and a chemical down-stream etching (CDE) technique to etch the node dielectric off the top portion of each of the deep trenches, and a self-defined, thermally-grown collar oxide that is formed during the node reoxidation of the SiN node dielectric.

Figure 5D:
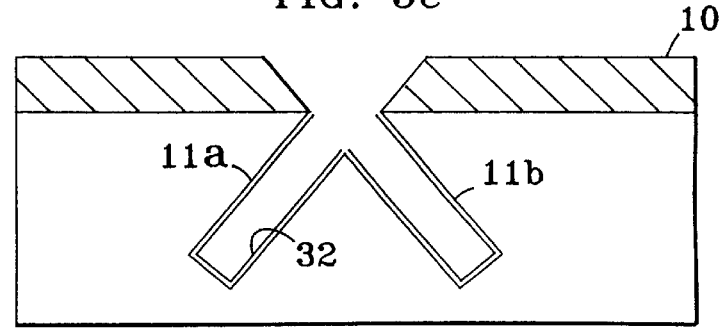
FIG. 5(d) shows a step in the collar formation with the deep trenches after the deposition of a SiN node dielectric.

Referring to FIG. 5(d), a cross-sectional view of deep trenches 11a and 11b etched in the silicon substrate 30 is shown. The collar formation method is implemented after a first resist fill for buried plate formation (not shown) and node dielectric 32 of SiN has been deposited in the deep trenches 11a and 11b using conventional Low Pressure Chemical Vapor Deposition (LPCVD) techniques.

Figure 5E:
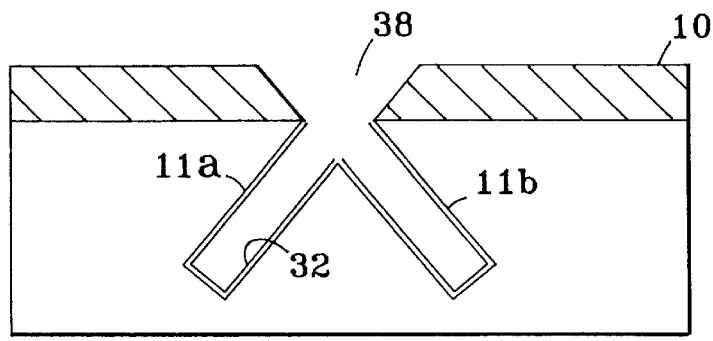
FIG. 5(e) shows a step in the collar formation with the deep trenches of FIG. 5(d) after filling the trenches with resist.
Figure 5F:
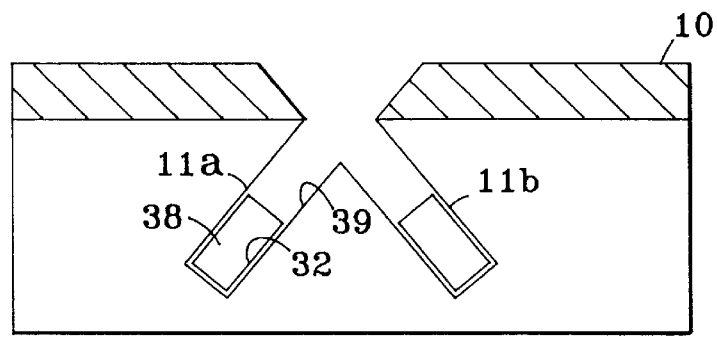
FIG. 5(f) shows a step in the collar formation with the deep trenches of FIG. 5(e) after recess etching the resist.
Figure 5G:
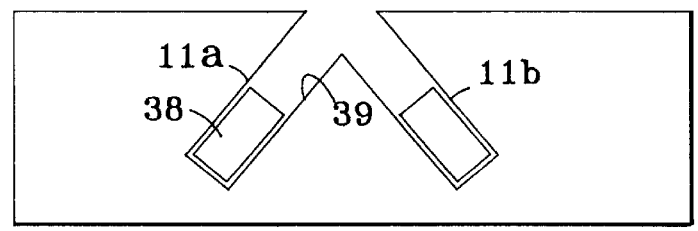
FIG. 5(g) shows a step in the collar formation with the deep trenches of FIG. 5(f) after stripping the mask and a resist clean of the deep trench.
Figure 5H:
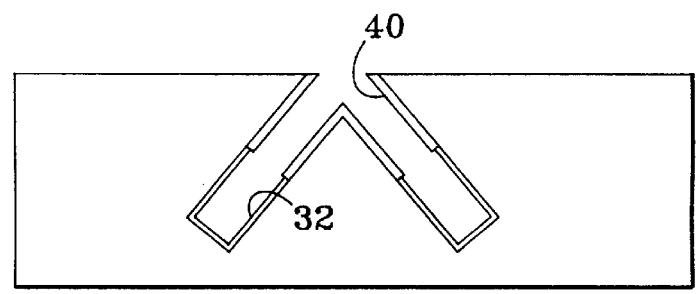
FIG. 5(h) shows a step in the collar formation with the deep trenches of FIG. 5(g) after a collar/node reoxidation.
Figure 5I:
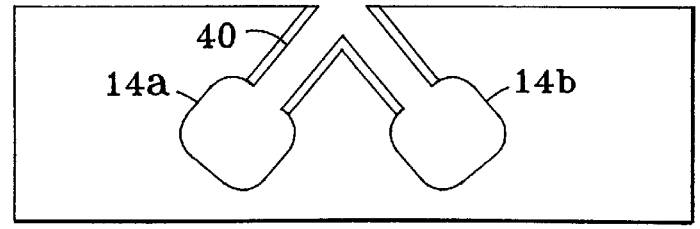
FIG. 5(i) shows a cross-sectional view after the isotropic etch has been completed.

After the node dielectric 32 has been deposited, a second resist fill 38 of for example, AZ 7500, is deposited (without baking) in the deep trenches 11a and 11b as shown in FIG. 5(e). Next, in FIG. 5(f), a second CDE is used to etch the resist fill 38. As can be seen, the node dielectic 32 has been removed entirely from the upper portion of the deep trench sidewall 39. During the CDE process, additional silicon can be removed from the upper portion of the deep trench sidewall 39 in order to enlarge the deep trenches 11a and 11b to account for the later growing of an oxide at the upper portion of the deep trench sidewall 39 which could hinder the proper filling of the deep trenches 11a and 11b with polysilicon.

In FIG. 5(*g*), the entire deep trench mask layer 10 that was used for forming the deep trench 38 has been stripped away using a 7:1 Buffered Hydrofluoric Acid (BHF) etch for 520s.

After stripping the deep trench mask layer 10 and performing a resist clean of the deep trenches 11a and 11b to remove the resist fill 38, a node reoxidation process is performed. As shown in FIG. 5(*h*), the node reoxidation process oxidizes the node dielectric 32 remaining in the deep trenches 11a and 11b and grows a collar oxide 40. The node reoxidation process uses a thermal wet oxidation performed at approximately 900° C. at 10 m wet $O_2$, to grow the collar oxide 40 along the deep trench sidewall 39.

The final step is to employ a chemical down-stream etching (CDE) technique to isotropically increase the size of the trenches 14a and 14b as shown in FIG. 5(*i*). The resulting bottle-shaped trench capacitors are shown in FIG. 3.

Figure 6A:
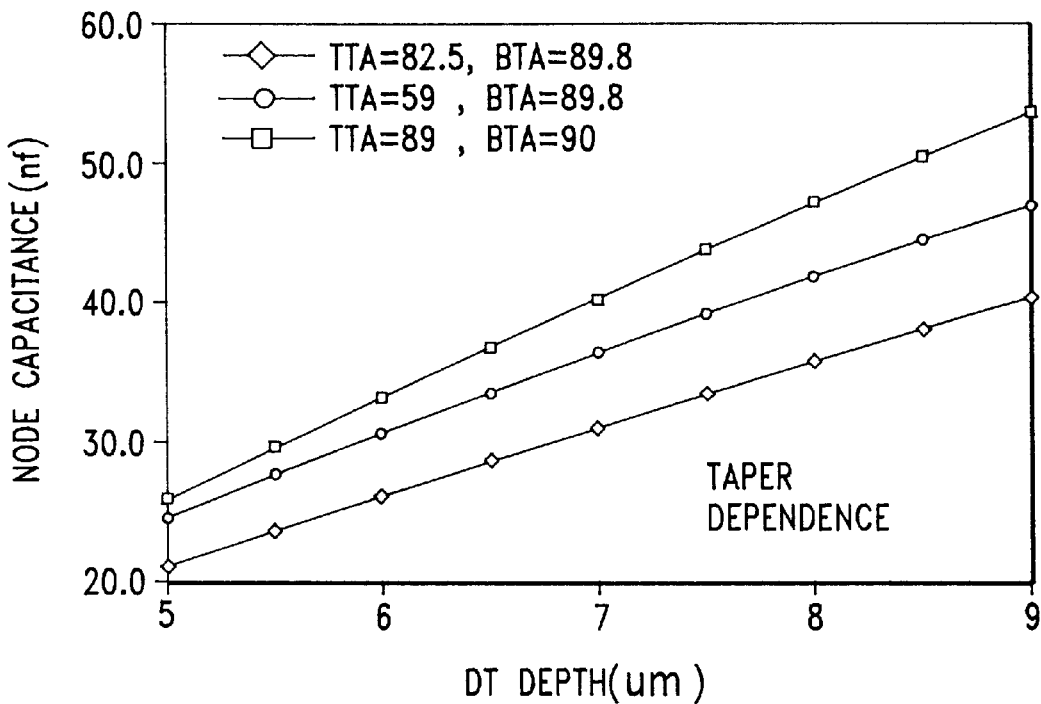
FIG. 6(a) shows a graph depicting the different capacitance achieved by varying the bottom and top taper angles of the trench.
Figure 6B:
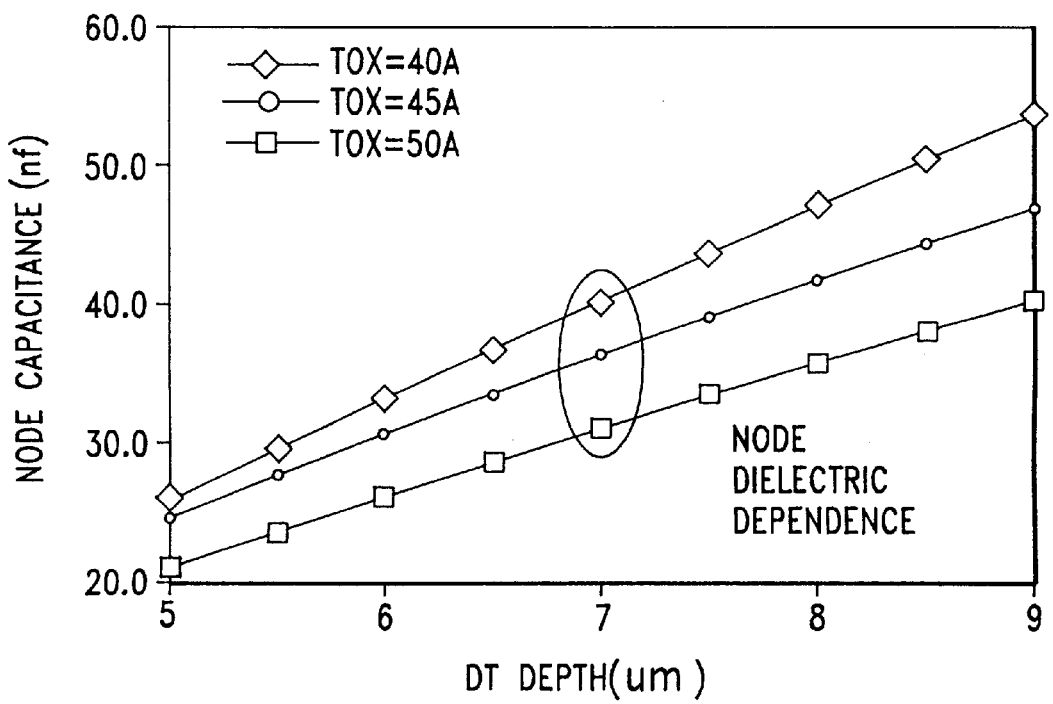
FIG. 6(b) shows a graph depicting the capacitance changes for changing values of the dielectric film thickness (Tox).
Figure 7A:
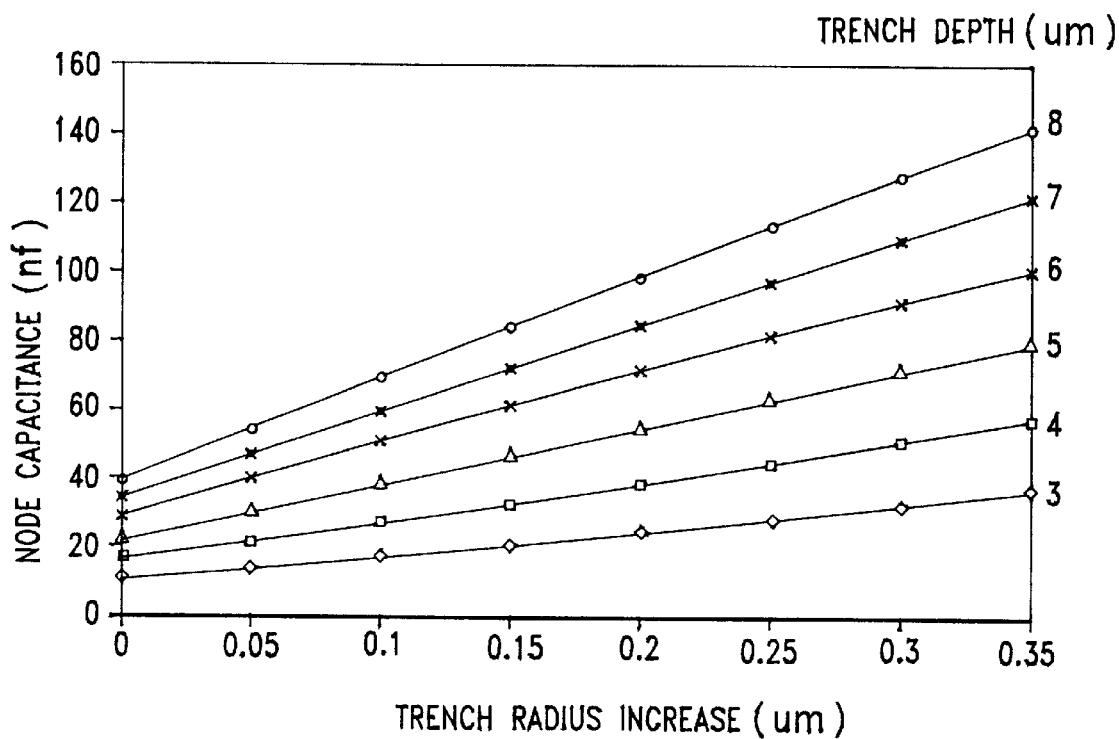
FIG. 7(a) shows how the node capacitance increases as the trench radius increases.
Figure 7B:
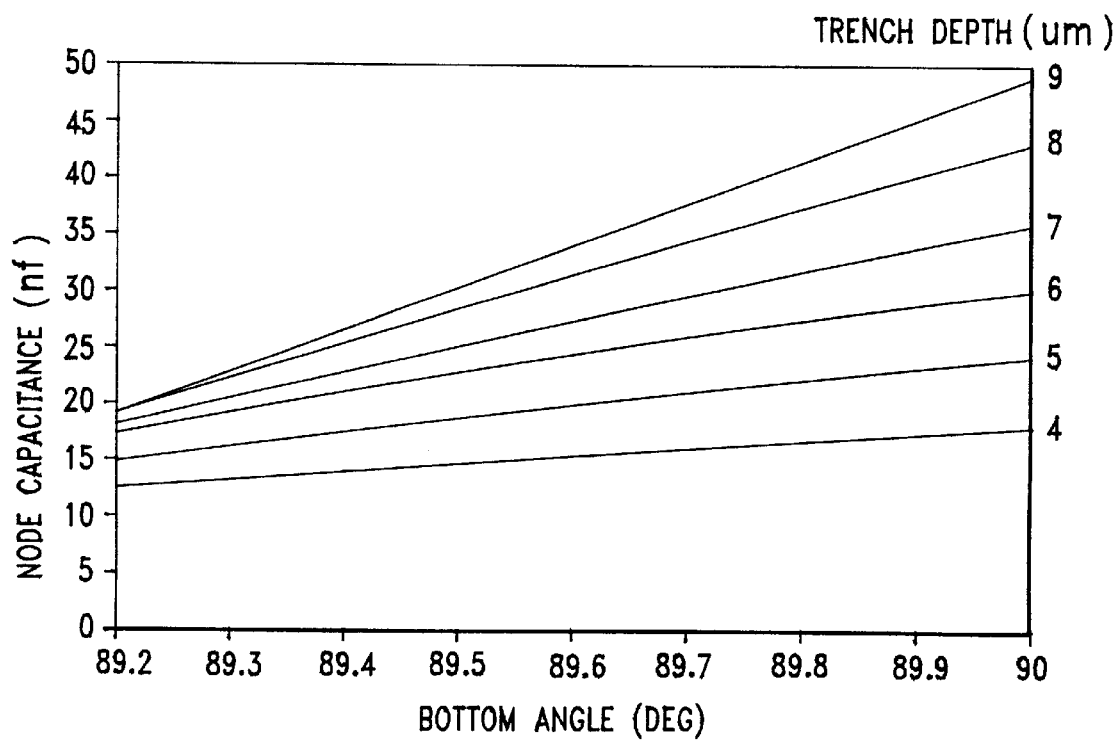
FIG. 7(b) shows how the node capacitance increases as the bottom taper angle increases.

FIG. 6(*a*) shows a graph of varying the bottom taper angle (BTA) and top taper angle (TTA) within the tilted trenches and the resulting change in the capacitance. The BTA is defined as the change in diameter within each of the trenches themselves below the level of the collar 40 and the TTA is the change in diameter within each of the trenches from the top to the bottom of the collar. FIG. 6(*b*) shows a graph of varying the dielectric film thickness (Tox) on the inside of the trench and the resulting change in the capacitance. FIG. 7(*a*) shows a graph of the increasing trench radius and resulting increase in node capacitance. FIG. 7(*b*) shows a graph of the increasing BTA and the resulting increase in node capacitance.

Although the present invention has been described above in specific terms, the description should be regarded as illustrative rather than limitative. Thus, workers of ordinary skill in the art will appreciate that the invention may be otherwise practiced, but that such alternative modes are encompassed by the terms of the following claims and equivalents thereto.

We claim:

1. A method of forming an oxide-containing layer on a selected portion of a sidewall of a trench extending into a semiconductor substrate, comprising the steps of:

forming a layer of covering material on a substantially vertically extending sidewall of a trench extending into a semiconductor substrate;

partially removing said layer of covering material over only a portion of said sidewall in order to expose an underlying region; and growing an oxide-containing layer on said exposed portion of said sidewall by local oxidation of said underlying region.

2. The method according to claim 1, wherein said step of forming a layer of material includes depositing said material by low pressure chemical vapor deposition (LPCVD).

3. The method according to claim 2, wherein said layer of covering material comprises silicon nitride.

4. The method according to claim 1, wherein said step of partially removing said layer of covering material includes the steps of:

filling said trench with a resist material; and etching said resist material a predetermined depth, thereby partially removing said layer of covering material and exposing said underlying region of said portion of said sidewall.

5. The method according to claim 4, wherein said trench extends more than one micron into said semiconductor substrate.

6. The method according to claim 1, wherein said step of growing a layer of oxide includes the step of oxidizing both said layer of covering material remaining on said sidewall and said exposed portion of said sidewall.

7. The method according to claim 1 further comprising the step of removing a portion of said layer of oxide in order to orient said layer of oxide a predetermined distance from said surface of said substrate.

8. The method according to claim 7 wherein said step of removing a portion of said layer of oxide comprises the steps of filling said trench with a resist material; and etching said resist a predetermined depth, thereby removing said portion of said layer of oxide from said sidewall.

9. The method according to claim 8 wherein said step of etching said resist etches said underlying region of said sidewall exposed by said partial removal of said layer of covering material.

10. The method according to claim 1, further comprising the step of planarizing said substrate after said step of filling.

11. The method according to claim 1, wherein said substrate is silicon.

12. A method of controllably defining boundaries of an oxide-containing layer formed on a substantially vertically extending sidewall of a trench extending into a semiconductor substrate, comprising the steps of:

depositing a conformal layer on a substantially vertically extending sidewall of said trench extending into a semiconductor substrate;

growing an oxide-containing layer on said sidewall by local oxidation;

filling said trench with a resist material; and etching said resist material a predetermined depth, thereby removing a portion of said oxide-containing layer from an upper portion of said sidewall in order to space said oxide-containing layer a selected distance from a surface of said substrate.

13. The method according to claim 12, further including the step of:

partially removing said conformal layer prior to said step of growing, in order to expose an underlying region of said upper portion of said sidewall where said oxide layer will be grown, wherein said step of growing includes:

oxidizing both said conformal layer remaining on said sidewall and said exposed region of said sidewall to form said oxide layer.

14. The method of claim 13 wherein said conformal layer is silicon nitride.

15. The method according to claim 13, wherein said step of partially removing said conformal layer includes the steps of:

filling said trench with a resist material; and etching said resist a predetermined depth thereby partially removing said conformal layer and exposing said underlying region of said upper portion of said sidewall.

16. The method according to claim 15, wherein said step of etching said resist etches said underlying region of said sidewall exposed by said partial removal said conformal layer.

17. The method according to claim 16, wherein said step of etching said resist includes chemical downstream etching (CDE).

18. The method according to claim 13, further comprising the step of planarizing said substrate after said step of filling.

* * * * *